United States Patent [19]
Katsuyama et al.

[11] Patent Number: 5,846,692
[45] Date of Patent: Dec. 8, 1998

[54] PATTERN FORMATION METHOD

[75] Inventors: Akiko Katsuyama; Masayuki Endo, both of Osaka, Japan

[73] Assignee: Matsushita Electric Industrial Co., Ltd., Osaka, Japan

[21] Appl. No.: 759,990

[22] Filed: Dec. 3, 1996

[30] Foreign Application Priority Data

Dec. 4, 1995 [JP] Japan .................................. 7-315053

[51] Int. Cl.$^6$ ...................................................... G03C 5/00
[52] U.S. Cl. ............................................. 430/311; 430/327
[58] Field of Search ..................................... 430/327, 311

[56] References Cited

U.S. PATENT DOCUMENTS 3,549,368  12/1970  Collins et al. ............................ 96/35.1

FOREIGN PATENT DOCUMENTS

| 1051622 | 2/1989 | Japan . |
| 6-084774 | 3/1994 | Japan . |
| 6-084787 | 3/1994 | Japan . |
| 7-249572 | 9/1995 | Japan . |

OTHER PUBLICATIONS

Endo, M. et al., "Stable Process for Chemically Amplified Resists Using a New Adhesion Promoter", *Proceedings of the Spie*, vol. 2724, pp. 139–148, Mar. 11, 1996.

Mittal, K.L., "Factors Affecting Adhesion of Lithographic Materials", *Solid State Techology*, vol. 22, No. 5, pp. 89–95, May 1979.

*Primary Examiner*—Janet C. Baxter
*Assistant Examiner*—Rosemary Ashton
*Attorney, Agent, or Firm*—McDermott, Will & Emery

[57] ABSTRACT

After forming a TiN film on a semiconductor substrate, a surface treatment agent in a gas phase, which is obtained by bubbling trimethylsilyl methylsulfonate with a nitrogen gas, is supplied onto the TiN film. The TiN film is then coated with a chemically amplified positive resist including an acid generator and a compound which can attain alkali solubility through the function of an acid, and a pre-bake process is subsequently conducted, thereby forming a resist film. The resist film is then exposed with a KrF excimer laser by using a desired mask. Through this exposure, an acid is generated from the acid generator included in the resist film. Since sulfonic acid produced from trimethylsilyl methylsulfonate weakens the function as a base of a nitrogen atom having a lone pair, the acid generated from the acid generator is not deactivated at the bottom of the resist film. As a result, a resist pattern with a satisfactory shape free from footing can be formed.

4 Claims, 5 Drawing Sheets

PATTERN FORMATION METHOD

BACKGROUND OF THE INVENTION

The present invention relates to a pattern formation method adopted in manufacturing a semiconductor device, and more particularly, it relates to a pattern formation method using a chemically amplified resist.

As process dimensions have recently been refined, a process utilizing a light source with a short wavelength has been developed for forming a fine line pattern in manufacturing ICs and LSIs. In a lithography process using a light source with a short wavelength, a resist obtained through concept of chemical amplification is generally used.

A chemically amplified resist is a multicomponent material including an acid generator for generating an acid through irradiation with an energy beam and a compound reactive through a function of the acid. The alkali dissolution characteristic of the chemically amplified resist is changed through the reaction with the acid catalyst, and a portion which has been changed to have alkali solubility or a portion which has not been changed to have the alkali solubility is developed with a developer so as to be removed, resulting in forming a resist pattern.

Now, an example of the conventional pattern formation method using the chemically amplified resist will be described with reference to FIGS. 4(a) through 4(d), 5(a) and 5(b).

First, as is shown in FIG. 4(a), a TiN film 2, that is, a film to be processed, is formed on a semiconductor substrate 1. On the surface of the TiN film 2, nitrogen atoms 3 each having a lone pair and hydroxyl groups 4 are present.

Then, as is shown in FIGS. 4(b) and 5(a), a hexamethyldisilazane (HMDS) gas 12 is supplied onto the surface of the TiN film 2, thereby conducting a surface treatment for improving adhesion with a resist film to be formed on the surface of the TiN film 2. Through this surface treatment, the HMDS gas 12 causes a hydrolytic reaction in the vicinity of the surface of the TiN film 2, so that a hydrogen atom of each hydroxyl group 4 is substituted with a trimethylsilyl group $(Si(CH_3)_3)$ 6 as is shown in FIG. 5(b). As a result, the surface of the TiN film 2 is changed from a highly hydrophilic state where the concentration of the hydroxyl group 4 is high (i.e., a state shown in FIG. 5(a)) to a hydrophobic state (i.e., a state shown in FIG. 5(b)). In this case, through the hydrolysis of HMDS, ammonia $(NH_3)$ 14, that is, a strong base, is produced.

Next, the entire surface of the TiN film 2 is coated with a chemically amplified positive resist as is shown in FIG. 4(c), and a pre-bake process is then conducted, thereby forming a resist film 8. Then, after conducting an exposing process with a KrF excimer laser 10 by using a desired mask 9, baking and development are conducted. Thus, a resist pattern 11 as shown in FIG. 4(d) is formed.

In the conventional pattern formation method, however, footing of the resist pattern 11 is caused as is shown in FIG. 4(d), and hence, a resist pattern with a satisfactory shape cannot be formed. As a result of study on the cause of this footing, the following has been found: Since ammonia 14, which is produced through the hydrolysis of HMDS and the nitrogen atoms 3 having the lone pairs, deactivates an acid generated from the acid generator included in the chemically amplified resist, it becomes difficult to proceed the reaction of the compound reactive through the function of the acid included in the chemically amplified resist.

This problem is caused in forming a resist pattern of a chemically amplified resist not only on the TiN film 2 but also on a SiN film.

Furthermore, when a BPSG film is formed on the semiconductor substrate 1, the following problems occur: On the surface of the BPSG film, phosphorus atoms and boron atoms each having a lone pair are present, and hence, these phosphorus atoms and the boron atoms having the lone pairs deactivate the acid generated from the acid generator. In addition, since the BPSG film has a high hygroscopic property, a large number of hydroxyl groups are adhered onto the surface of the BPSG film. These hydroxyl groups are reacted with the acid generated from the acid generator, resulting in deactivating the acid generated from the acid generator. In this case, when a surface treatment using HMDS is performed in order to make the BPSG film hydrophobic, ammonia is produced as described above, and the acid is also deactivated.

Additionally, hydroxyl groups are easily adhered onto the surface of a silicon substrate bearing no TiN or BPSG film, and therefore, the above-described problems can be caused.

When a chemically amplified positive resist is used, the footing of the resultant resist pattern is caused as described above. When a chemically amplified negative resist is used, another problem occurs that undercut of the resultant resist pattern is caused.

In view of these problems, Japanese Laid-Open Patent Publication No. 6-84774 discloses a method of forming a resist pattern of a chemically amplified resist on a thin film of a silicon oxide film or a silicon nitride film including neither boron nor phosphorus and formed on a semiconductor substrate. However, this method including the formation of the thin film on the semiconductor substrate disadvantageously makes the manufacturing process complicated and increases the manufacturing cost.

SUMMARY OF THE INVENTION

In view of the aforementioned conventional problems, the object of the invention is suppressing deactivation of an acid generated from an acid generator so as to form a resist pattern free from footing and undercut, without complicating the process and increasing manufacturing cost.

In order to achieve this object, a surface treatment agent for producing an acid or a surface treatment agent including an acid is used for a surface treatment of a semiconductor substrate in this invention.

The first pattern formation method of this invention comprises the steps of conducting a surface treatment on a semiconductor substrate by supplying a surface treatment agent, which has a silyl group and produces an acid, onto a surface of the semiconductor substrate; forming a resist film on the semiconductor substrate whose surface has been treated with the surface treatment agent by coating the semiconductor substrate with a chemically amplified resist; and forming a resist pattern by exposing the resist film by using a desired mask and subsequently conducting development.

According to the first pattern formation method, a hydrogen atom of a hydroxyl group present on the semiconductor substrate is substituted with a silyl group, and hence, the property of the surface of the semiconductor substrate is changed from hydrophilicity into hydrophobicity. In addition, an atom having a lone pair can be weakened in its function as a base by the acid produced from the surface treatment agent. Accordingly, an acid generated from the acid generator included in the chemically amplified resist cannot be deactivated. As a result, a resist pattern free from footing and undercut can be formed. Thus, without complicating the process and increasing the manufacturing cost, a resist pattern with an excellent shape can be stably formed.

In one aspect of the first pattern formation method, the surface treatment agent preferably produces sulfonic acid as the acid. Thus, sulfonic acid definitely weakens the function as a base of the atom having the lone pair, and hence, the deactivation of the acid generated from the acid generator can be prevented without fail, resulting in definitely preventing the footing and undercut of the resist pattern.

In another aspect of the first pattern formation method, the surface treatment agent is preferably represented by a general formula:

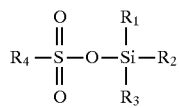

wherein $R_1$, $R_2$ and $R_3$ indicate the same or different, saturated or unsaturated hydrocarbon groups each having 1 through 6 carbon atoms; and $R_4$ indicates an alkyl group having 1 through 6 carbon atoms, an alkyl substituent having 1 through 6 carbon atoms, a phenyl group, a phenyl substituent, a benzyl group or a benzyl substituent.

Thus, a reaction shown by Chemical Formula 2 is caused on the surface of the semiconductor substrate.

Chemical Formula 1:

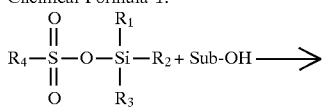

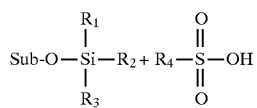

As is shown in this reaction formula, the compound of Chemical Formula 1 is decomposed into a silyl group of Chemical Formula 3 and sulfonic acid of Chemical Formula 4, not giving any other byproduct.

Chemical Formula 3:

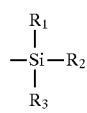

Chemical Formula 4:

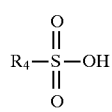

As a result, the silyl group of Chemical Formula 3 changes the property of the surface of the semiconductor substrate into hydrophobicity, and sulfonic acid of Chemical Formula 4 definitely weakens the function as a base of the atom having the lone pair. In addition, another byproduct, for example, ammonia and amines which can harmfully affect the chemically amplified resist, is not produced. Therefore, a resist pattern with a stable shape can be definitely formed.

The second pattern formation method of this invention comprises the steps of conducting a surface treatment on a semiconductor substrate by supplying a surface treatment agent, including a compound having a silyl group and an acid, onto a surface of the semiconductor substrate; forming a resist film on the semiconductor substrate whose surface has been treated with the surface treatment agent by coating the semiconductor substrate with a chemically amplified resist; and forming a resist pattern by exposing the resist film by using a desired mask and subsequently conducting development.

According to the second pattern formation method, a hydrogen atom of a hydroxyl group present on the semiconductor substrate is substituted with a silyl group, and hence, the property of the surface of the semiconductor substrate is changed from hydrophilicity into hydrophobicity. In addition, an atom having a lone pair present on the semiconductor substrate can be weakened in its function as a base by the acid included in the surface treatment agent. Therefore, an acid generated from the acid generator included in the chemically amplified resist cannot be deactivated. As a result, a resist pattern free from footing and undercut can be formed.

Furthermore, by adjusting a mixing ratio between the compound having a silyl group and the acid, an optimal surface treatment agent can be obtained in accordance with the types of the semiconductor substrate such as a TiN film, a SiN film and a BPSG film.

In one aspect of the second pattern formation method, the acid included in the surface treatment agent is preferably carboxylic acid or sulfonic acid. Thus, the footing and undercut can be prevented without fail.

In another aspect of the second pattern formation method, the compound included in the surface treatment agent is preferably represented by a general formula:

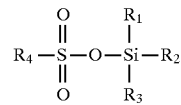

wherein $R_1$, $R_2$ and $R_3$ indicate the same or different, saturated or unsaturated hydrocarbon groups each having 1 through 6 carbon atoms; and $R_4$ indicates an alkyl group having 1 through 6 carbon atoms, an alkyl substituent having 1 through 6 carbon atoms, a phenyl group, a phenyl substituent, a benzyl group or a benzyl substituent.

Thus, the compound of Chemical Formula 5 is decomposed into a silyl group and sulfonic acid through the reaction shown by Chemical Formula 2 as described above, not giving any other byproduct. Therefore, ammonia and amines which can harmfully affect the chemically amplified resist are not produced, resulting in definitely forming a resist pattern with a stable shape.

DETAILED DESCRIPTION OF THE INVENTION (Embodiment 1)

A pattern formation method according to a first embodiment of the invention will now be described with reference to FIGS 1(a) through 1(d), 2(a) and 2(b).

Figure 1A:
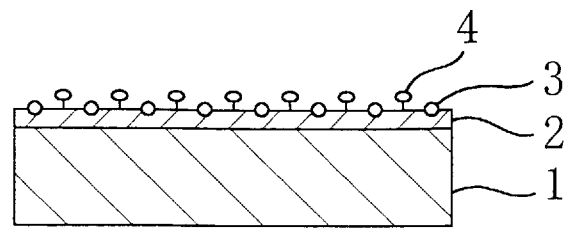
FIGS. 1(a) through 1(d) are schematic sectional views for showing procedures in a pattern formation method according to a first embodiment of the invention.

First, as is shown in FIG. 1(a), a TiN film 2 is formed on a semiconductor substrate 1. In this case, since nitrogen atoms 3 having lone pairs and hydroxyl groups 4 are present on the surface of the TiN film 2 as described above, the TiN film 2 has hydrophilic and basic properties.

Figure 1B:
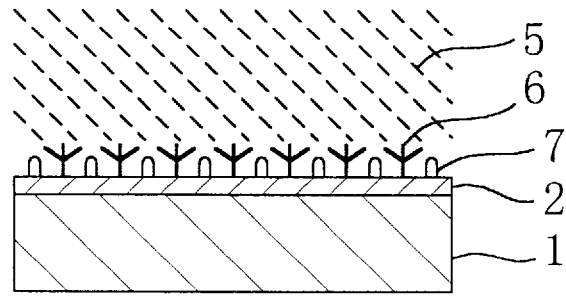
Figure 2A:
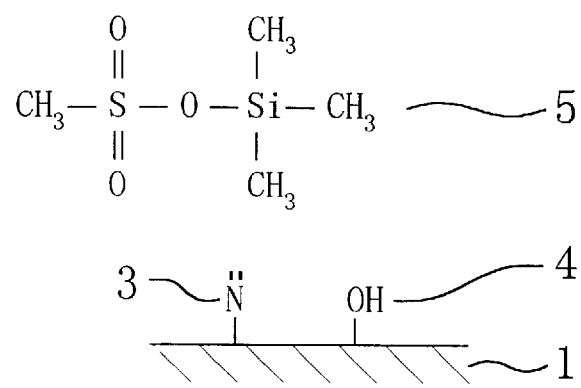
FIGS. 2(a) and 2(b) are schematic diagrams for showing a surface treatment process conducted in the pattern formation method of the first embodiment.

Then, as is shown in FIGS. 1(b) and 2(a), a surface treatment agent 5 in a gas phase, which is obtained by bubbling trimethylsilyl methylsulfonate in a liquid phase represented by Chemical Formula 6 below with a nitrogen gas, is supplied onto the surface of the TiN film 2.

Chemical Formula 6:

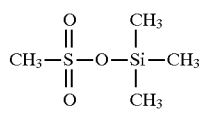

Figure 2B:
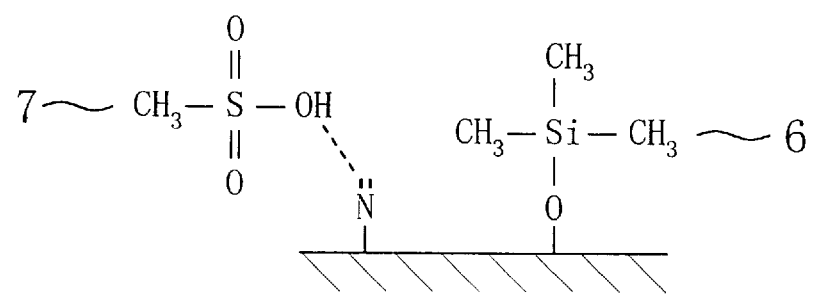

In this manner, as is shown in FIGs. 1(b) and 2(b), trimethylsilyl methylsulfonate is decomposed into a trimethylsilyl group 6 and sulfonic acid 7, and the hydroxyl group 4 on the surface of the TiN film 2 is substituted with the trimethylsilyl group 6, so that the property of the TiN film 2 is changed from hydrophilicity into hydrophobicity. In addition, the sulfonic acid 7 weakens the function as a base of the nitrogen atoms having the lone pairs.

Figure 1C:
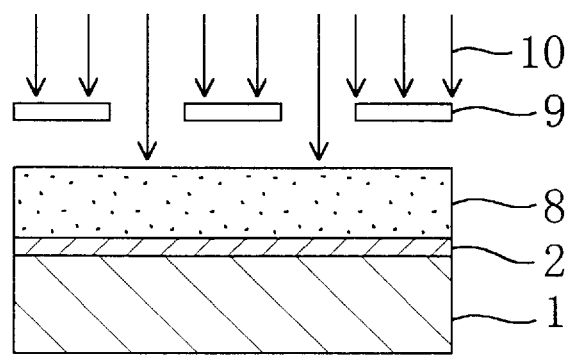

Next, the TiN film 2 is coated with a chemically amplified positive resist including an acid generator for generating an acid through exposure and a compound which attains alkali solubility through the function of the acid, for example, WKR-PT-2 (manufactured by Wako Pure Chemical Industries, Ltd.), and then, the resultant TiN film 2 is subjected to a pre-bake process at a temperature of 90° C. for 90 seconds. Thus, a resist film 8 with a thickness of 1.0 μm is formed as is shown in FIG. 1(c). Subsequently, by exposing the resist film 8 with a KrF excimer laser 10 by using a desired mask 9, the acid is generated from the acid generator included in the resist film 8. Since the basic function of the nitrogen atoms having the lone pairs is weakened by the sulfonic acid 7 as described above, the acid generated from the acid generator is not deactivated at the bottom of the resist film 8.

Figure 1D:
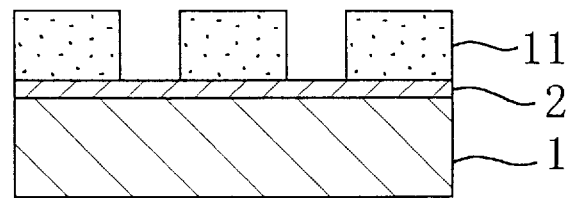

Next, the resist film 8 is subjected to a baking by using a hot plate oven at a temperature of 110° C. for 90 seconds, thereby proceeding the catalytic reaction of the acid. A developing process is then conducted for 60 seconds by using a developer including 2.38 wt % tetramethylammonium hydroxide. Thus, a resist pattern 11 with a satisfactory shape free from footing can be formed as is shown in FIG. 1(d).

In this manner, the surface treatment of the TiN film 2 is conducted by using the surface treatment agent including trimethylsilyl methylsulfonate represented by Chemical Formula 6 in this embodiment. Accordingly, the property of the TiN film 2 is changed from hydrophilicity into hydrophobicity, and the basic function of the nitrogen atoms having the lone pairs can be weakened. As a result, the acid generated from the acid generator can be prevented from being deactivated, and the resultant resist pattern can be free from the footing.

The surface treatment agent including trimethylsilyl methylsulfonate can be replaced with another surface treatment agent including trimethylsilyl trifluoromethylsulfonate represented by Chemical Formula 7 or trimethylsilyl p-toluenesulfonate represented by Chemical Formula 8.

Chemical Formula 7:

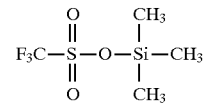

Chemical Formula 8:

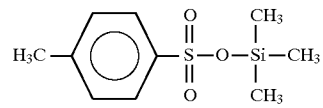

Alternatively, a surface treatment agent which can produce carboxylic acid or any of sulfonic acids other than methylsulfonic acid and toluenesulfonic acid can be used.

(Embodiment 2)

Figure 3A:
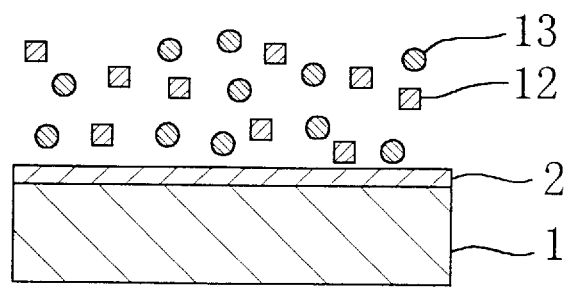
FIGS. 3(a) and 3(b) are schematic sectional views for showing a surface treatment process conducted in a pattern formation method according to a second embodiment of the invention.
Figure 3B:
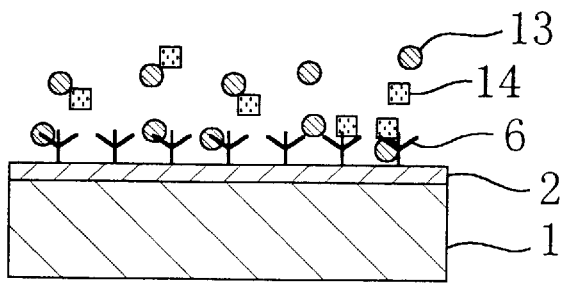
Figure 4A:
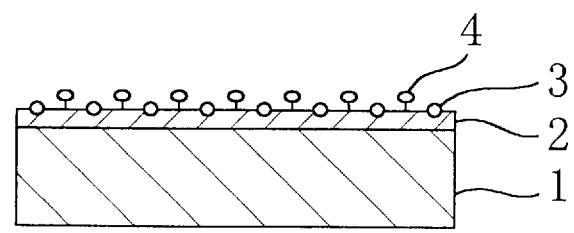
FIGS. 4(a) through 4(d) are schematic sectional views for showing procedures in a conventional pattern formation method.
Figure 4B:
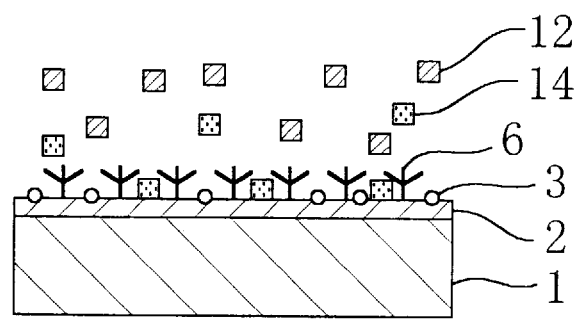
Figure 4C:
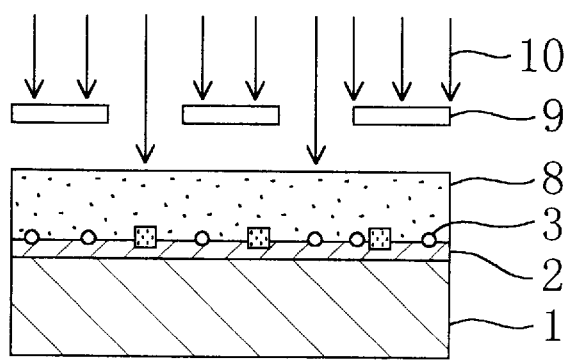
Figure 4D:
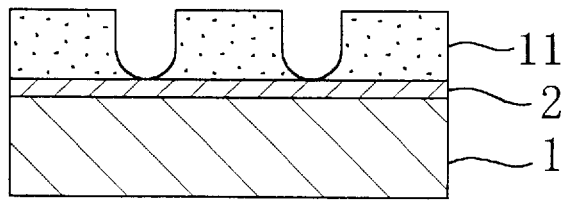
Figure 5A:
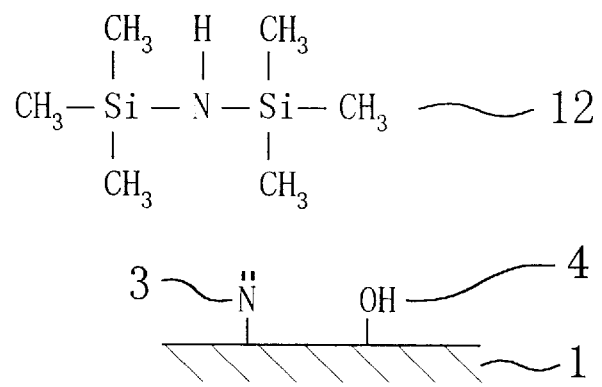
FIGS. 5(a) and 5(b) are schematic diagrams for showing a surface treatment process conducted in the conventional pattern formation method.
Figure 5B:
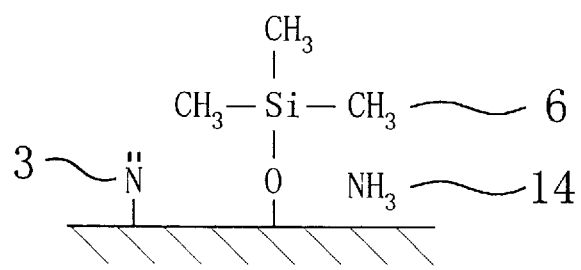

A pattern formation method according to a second embodiment of the invention will now be described with reference to FIGS. 3(a) and 3(b).

First, a TiN film 2 is formed on a semiconductor substrate 1 in the same manner as in the first embodiment. Also in this embodiment, nitrogen atoms having lone pairs and hydroxyl groups are present on the surface of the TiN film 2, and the TiN film 2 has hydrophilic and basic properties.

Next, a surface treatment agent in a gas phase, obtained by bubbling a mixed solution of HMDS and acetic acid with a nitrogen gas, is supplied onto the surface of the TiN film 2. The mixing ratio between the surface treatment agent in a gas phase and the bubbling gas is preferably adjusted in consideration of a time duration for supplying the surface treatment agent, a flow rate of the nitrogen gas and the like. In this manner, the surface of the TiN film 2 is exposed to an atmosphere of the mixed gas of HMDS 12 and acetic acid 13 as is shown in FIG. 3(a). Accordingly, a hydrogen atom of the hydroxyl group on the surface of the TiN film 2 is substituted with a trimethylsilyl group 6 produced through hydrolysis of HMDS 12, so that the property of the surface of the TiN film 2 is changed into hydrophobicity, and ammonia 14 is produced on the TiN film 2. Furthermore, the nitrogen atoms having the lone pairs and ammonia 14 on the surface of the TiN film 2 are reacted with acetic acid 13 to be neutralized.

Next, similarly to the first embodiment, the TiN film 2 is coated with a chemically amplified positive resist including an acid generator for generating an acid through exposure and a compound which can attain the alkali solubility through the function of the acid. Then, a pre-bake process is conducted at a temperature of 90° C. for 90 seconds, thereby forming a resist film. The resist film is then exposed with a KrF excimer laser by using a desired mask. Through this exposure, the acid is generated from the acid generator included in the resist film. Since acetic acid 13 included in the surface treatment agent weakens the basic function of the nitrogen atoms having the lone pairs, the acid generated from the acid generator cannot be deactivated at the bottom of the resist film.

The resist film is then subjected to a baking by using a hot plate oven at a temperature of 110° C. for 90 seconds, thereby proceeding the catalytic reaction of the acid. Then, a developing process is conducted for 60 seconds by using a developer including 2.38 wt % tetramethylammonium hydroxide. Thus, a resist pattern with a satisfactory shape free from footing can be formed.

In this manner, the surface treatment is conducted on the TiN film 2 by using the surface treatment agent including HMDS and acetic acid in this embodiment. Accordingly, the property of the TiN film 2 is changed from hydrophilicity into hydrophobicity, and the function as a base of the nitrogen atoms having the lone pairs can be weakened. As a result, the acid generated from the acid generator can be prevented from being deactivated, so that the resultant resist pattern can attain a satisfactory shape without the footing. Ammonia 14 produced from HMDS 12 is neutralized with acetic acid 13, and hence does not deactivate the acid.

Furthermore, the surface treatment agent used in the second embodiment includes the mixed solution of HMDS for changing the property of the surface of the TiN film 2 into hydrophobicity and acetic acid for weakening the basic function of the nitrogen atoms having the lone pairs. Therefore, by changing the mixing ratio between HMDS and acetic acid, the degree for changing the property from hydrophilicity into hydrophobicity and the concentration of the acid working as a base can be separately adjusted. As a result, it is possible to definitely cope with various types of underlying films below the resist film.

In this embodiment, HMDS is included in the surface treatment agent as a compound having a silyl group, but HMDS can be appropriately replaced with a compound having a silyl group such as trialkylsilyl group. In particular, trimethylsilyl methylsulfonate used in the first embodiment, trimethylsilyl trifluoromethylsulfonate or trimethylsilyl p-toluenesulfonate is preferably used because such a compound does not produce ammonia but produces an acid.

In the second embodiment, acetic acid is used as an acid included in the surface treatment agent, but acetic acid can be replaced with any of sulfonic acid and other carboxylic acids such as formic acid and propionic acid.

In the first and second embodiments, the description is made on the formation of the resist pattern on the TiN film 2 formed on the semiconductor substrate 1. However, the surface treatment agents of the first and second embodiments can exhibit their effects in forming a resist pattern on a basic SiN film or a hygroscopic BPSG film and forming a resist pattern on the semiconductor substrate 1 of silicon or the like. Specifically, when the surface treatment agent of the first or second embodiment is used for a surface treatment on a SiN film, the function as a base of a nitrogen atom having a lone pair is weakened, and when it is used for a surface treatment on a BPSG film, the function as a base of a phosphorus or boron atom having a lone pair is weakened.

In addition, in the first and second embodiments, a chemically amplified positive resist such as WKR-PT-2 is used as the resist, but another chemically amplified positive resist can be used, or a chemically amplified negative resist can be used. In using a chemically amplified negative resist, the resultant resist pattern can be prevented from being eroded.

What is claimed is:

1. A pattern formation method comprising the steps of:

conducting a surface treatment on a semiconductor substrate by supplying a surface treatment agent, which has a silyl group and produces an acid, onto a surface of said semiconductor substrate;

forming a resist film on said semiconductor substrate, whose surface has been treated with said surface treatment agent, by coating said semiconductor substrate with a chemically amplified resist; and forming a resist pattern by exposing said resist film by using a desired mask and subsequently conducting development.

2. The pattern formation method of claim 1, wherein said surface treatment agent produces sulfonic acid as said acid.

3. The pattern formation method of claim 1, wherein said surface treatment agent is represented by a general formula:

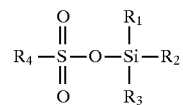

wherein $R_1$, $R_2$ and $R_3$ indicate the same or different, saturated or unsaturated hydrocarbon groups each having 1 through 6 carbon atoms; and $R_4$ indicates an alkyl group having 1 through 6 carbon atoms, an alkyl substituent having 1 through 6 carbon atoms, a phenyl group, a phenyl substituent, a benzyl group or a benzyl substituent.

4. A pattern formation method comprising the steps of:

conducting a surface treatment on a semiconductor substrate by supplying onto a surface of said semiconductor substrate a surface treatment agent, including a compound having a silyl group and an acid, wherein said compound included in said surface treatment agent is represented by a general formula:

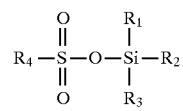

wherein $R_1$, $R_2$ and $R_3$ indicate the same or different, saturated or unsaturated hydrocarbon groups each having 1 through 6 carbon atoms;

and $R_4$ indicates an alkyl group having 1 through 6 carbon atoms, an alkyl substituent having 1 through 6 carbon atoms, a phenyl group, a phenyl substituent, a benzyl group or a benzyl substituent;

forming a resist film on said semiconductor substrate, whose surface has been treated with said surface treatment agent, by coating said semiconductor substrate with a chemically amplified resist; and forming a resist pattern by exposing said resist film by using a desired mask and subsequently conducting development.

* * * * *